United States Patent
Kim

(10) Patent No.: US 7,149,138 B2
(45) Date of Patent: Dec. 12, 2006

(54) INCREASING A REFRESH PERIOD IN A SEMICONDUCTOR MEMORY DEVICE

(75) Inventor: Jung Pill Kim, Ichon-shi (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/500,922

(22) PCT Filed: Jan. 10, 2003

(86) PCT No.: PCT/KR03/00051

§ 371 (c)(1),
(2), (4) Date: Jul. 8, 2004

(87) PCT Pub. No.: WO03/058635

PCT Pub. Date: Jul. 17, 2003

(65) Prior Publication Data

US 2005/0122809 A1    Jun. 9, 2005

Related U.S. Application Data

(60) Provisional application No. 60/346,897, filed on Jan. 11, 2002.

(51) Int. Cl.
*G11C 7/00* (2006.01)
(52) U.S. Cl. .................. 365/203; 365/207
(58) Field of Classification Search ........... 365/203, 365/207
See application file for complete search history.

(56) References Cited

U.S. PATENT DOCUMENTS

| | | | | |
|---|---|---|---|---|
| 4,933,907 A | * | 6/1990 | Kumanoya et al. | 365/222 |
| 5,375,095 A | * | 12/1994 | Yamada et al. | 365/230.03 |
| 5,559,737 A | * | 9/1996 | Tanaka et al. | 365/185.25 |
| 5,572,465 A | | 11/1996 | Bashir | |
| 6,061,278 A | * | 5/2000 | Kato et al. | 365/190 |
| 6,320,780 B1 | * | 11/2001 | Mueller et al. | 365/63 |
| 6,479,851 B1 | * | 11/2002 | Lee | 257/300 |
| 6,594,174 B1 | * | 7/2003 | Choi et al. | 365/145 |
| 6,646,906 B1 | * | 11/2003 | Salling | 365/145 |
| 6,759,280 B1 | * | 7/2004 | Lee | 438/129 |
| 6,839,258 B1 | * | 1/2005 | Patel | 365/49 |

FOREIGN PATENT DOCUMENTS

| | | |
|---|---|---|
| EP | 09-28004 A2 | 7/1999 |
| EP | 09 87714 A2 | 3/2000 |
| JP | 2001-28190 | 1/2001 |
| KR | 1994-0008139 | 9/1994 |

OTHER PUBLICATIONS

Copy of Search Report dated Apr. 7, 2003.
Korean Office Action dated Dec. 2, 2005, with reference No. 0080847.

* cited by examiner

*Primary Examiner*—Michael Tran
(74) *Attorney, Agent, or Firm*—Pillsbury Winthrop Shaw Pittman LLP

(57) ABSTRACT

In one method according to an embodiment of the invention, a reference bitline is biased and a refresh period of a DRAM cell is increased. In one example of such a method, biasing the reference bitline includes applying a predetermined bias voltage. In a memory device according to one embodiment of the invention, a bias circuit includes a bias capacitor connected to a bitline and configured and arranged to receive a bias signal.

18 Claims, 14 Drawing Sheets

INCREASING A REFRESH PERIOD IN A SEMICONDUCTOR MEMORY DEVICE

CROSS-REFERENCE TO RELATED APPLICATIONS

This Application claims benefit of International Patent Application No. PCT/KR03/00051, filed Jan. 10, 2003, which claims benefit of U.S. Provisional Patent Application No. 60/346,897, filed Jan. 11, 2002, both of these documents being incorporated herein by reference in their entireties.

TECHNICAL FIELD

The present invention relates to a semiconductor memory device; and, more particularly, to data storage in the semiconductor memory device.

BACKGROUND ART

Semiconductor random-access memories are widely used in electronic computing applications. For many applications, dynamic random access memory (DRAM) devices are preferred for such features as high storage density and low cost.

FIG. 1 shows a circuit diagram of a one-transistor DRAM cell. The cell includes a cell capacitor C that stores a charge corresponding to a data value. Cell capacitor C is coupled to a bitline BL through a field-effect transistor (FET) M1, and the gate of FET M1 is connected to a wordline WL.

Before the cell is read, the inherent capacitance $C_{BL}$ of bitline BL is precharged to a predetermined level. To retrieve the data value stored in cell capacitor C, wordline WL is pulled high to activate FET M1. This action causes charge sharing between cell capacitor C and inherent capacitance $C_{BL}$. This charge sharing causes the voltage on bitline BL to vary from the precharge level according to the charge stored in cell capacitor C. A sense amplifier (not shown) detects and amplifies the voltage change on bitline BL to retrieve and output the corresponding data value.

One disadvantage of a DRAM cell as shown in FIG. 1 is that the level of the charge stored by cell capacitor C deteriorates over time (e.g. through leakage due to a non-ideal dielectric). Once the charge level has deteriorated to the point where the sense amplifier can no longer properly detect the corresponding voltage change on bitline BL, the stored data value is lost. Therefore, it is necessary to refresh the charge stored in the cell capacitor from time to time.

When a DRAM cell is being refreshed, the stored data value cannot be accessed and a new data value cannot be stored. Therefore, the need for refresh activity imposes a limit on the performance of a memory system that includes DRAM devices. It is desirable to increase the period between refresh operations (the "refresh period") in order to reduce the impact of this activity on memory system performance.

Increasing the refresh period may also reduce power consumption. In order to retain the information stored in its DRAM devices, for example, an electronic unit performs refresh operations even when the unit is not in active use. In the case of a handheld unit such as a cellular telephone, a personal digital assistant, or a notebook computer, power expended in performing DRAM refresh may represent a significant portion of the unit's total standby power drain. By reducing the number of refresh operations that are performed over a given period of time, increasing the refresh period may reduce the standby power consumption of the unit and help to extend the period over which such a unit may remain in standby mode for a single battery charge.

One technique for achieving a longer period between refresh operations is to increase the capacitance of cell capacitor C. However, this technique may include increasing the size of cell capacitor C, and undesirable effects of such an increase may include a reduction in storage density and/or a greatly increased circuit area.

Another technique for achieving a longer period between refresh operations is to reduce the ratio of the capacitance of the bitline to the capacitance of the cell capacitor. By increasing the magnitude of the voltage change on the bitline upon charge sharing, this technique may extend the period over which the charge on the cell capacitor remains detectable. Unfortunately, this technique may also include increasing the size of the cell capacitor. It is desirable to increase the period between refresh operations in a DRAM device without increasing the size of a cell capacitor.

SUMMARY

In a method according to one embodiment of the invention, a first bitline and a second bitline are precharged. Charge sharing between a cell capacitor and the precharged first bitline is permitted, and a selected one of the precharged bitlines is biased. For example, biasing a bitline may include reducing a potential of the bitline. Biasing a bitline may also include applying a potential to a bias capacitor coupled to the selected bitline. Subsequent to the charge sharing and the biasing, a difference between the potentials of the bitlines of the first and second memory cells is sensed, where sensing the difference between the potentials may include amplifying the difference between the potentials.

BRIEF DESCRIPTION OF THE DRAWINGS

Other objects and aspects of the invention will become apparent from the following description of the embodiments with reference to the accompanying drawings, in which.

DETAILED DESCRIPTION

Figure 1:
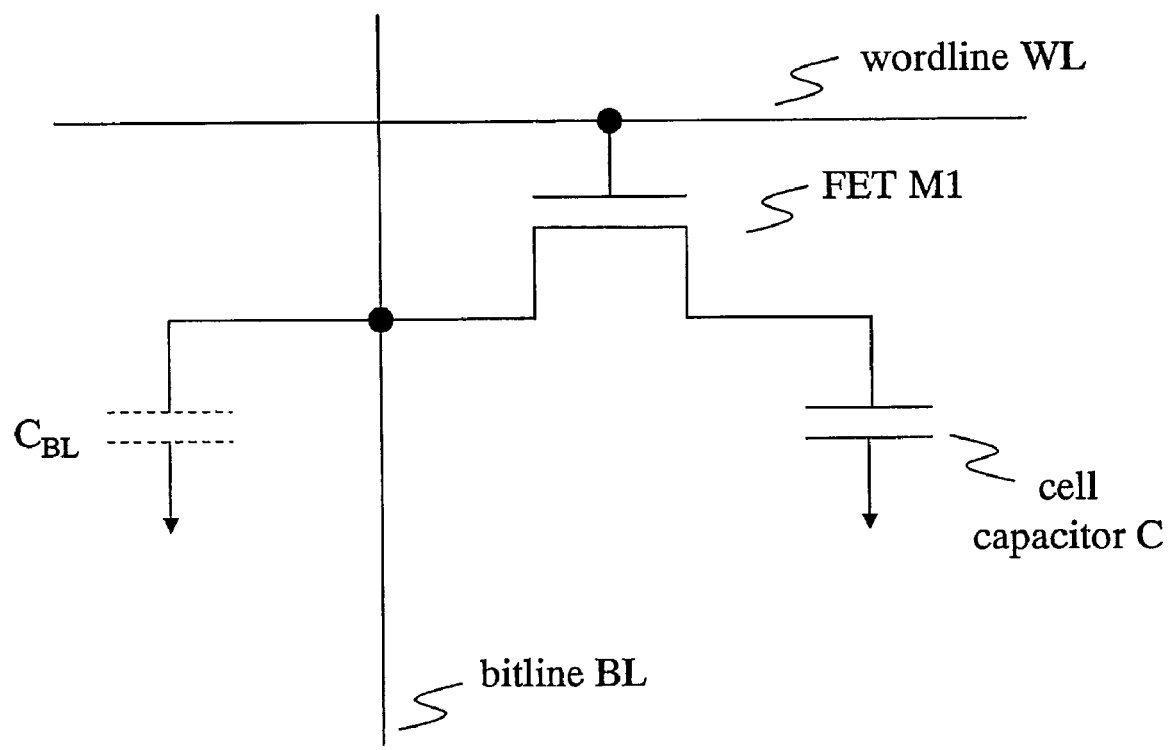
FIG. 1 is a schematic diagram of a one-transistor DRAM cell.
Figure 2:
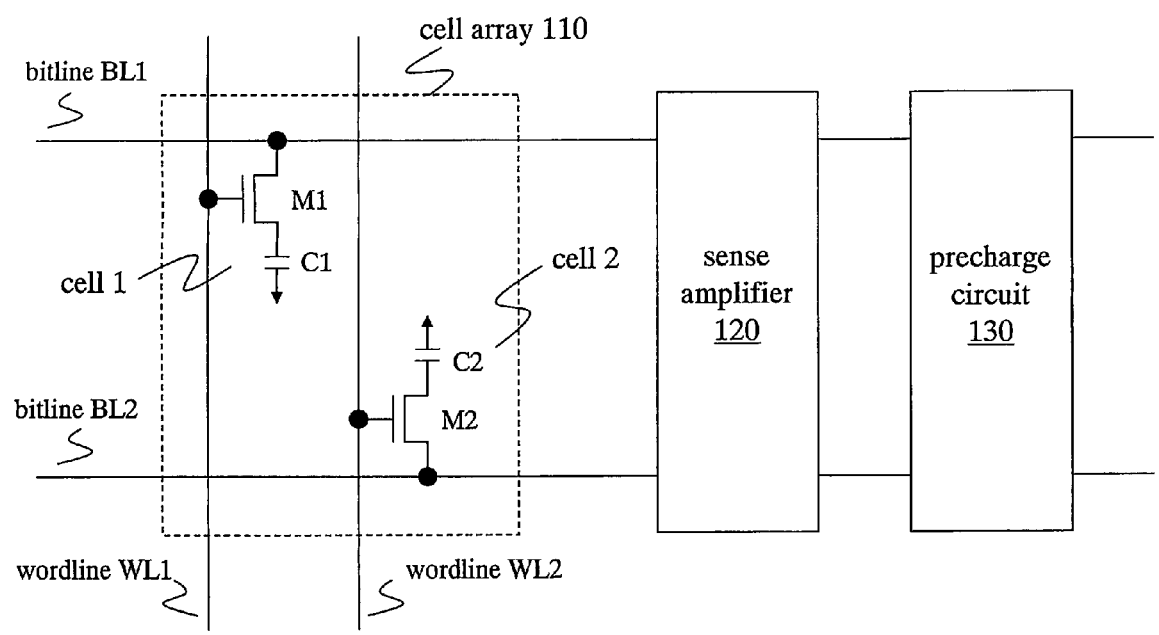
FIG. 2 is a block diagram of a device including a cell array, a sense amplifier, and a precharge circuit.

FIG. 2 shows a block diagram of a DRAM device that includes a cell array 110, a sense amplifier 120, and a precharge circuit 130. Cell array 110 includes two instances of the cell shown in FIG. 1: cell 1 comprising FET M1 and cell capacitor C1, and cell 2 comprising FET M2 and cell capacitor C2. In exemplary implementations, each of the cell capacitors C1, C2 may be fabricated as a two-terminal capacitor or as a trench capacitor. In other implementations of a device as shown in FIG. 2, the series connection of cell array 110, sense amplifier 120, and precharge circuit 130 along bitline BL1, BL2 may occur in any order.

In an exemplary application of the device of FIG. 2, the ends of cell capacitors C1, C2 opposite FETs M1, M2 are connected to a potential having a value of Vdd/2. In such case a data value may be entered into a cell by storing a voltage Vdd (for 'high' or data '1') or a voltage Vss (for 'low' or data '0') across the cell capacitor. In exemplary implementations, a difference between Vdd and Vss may be as great as three, five, or nine volts or more or as little as one-and-one-half volts or one volt or less.

Figure 3:
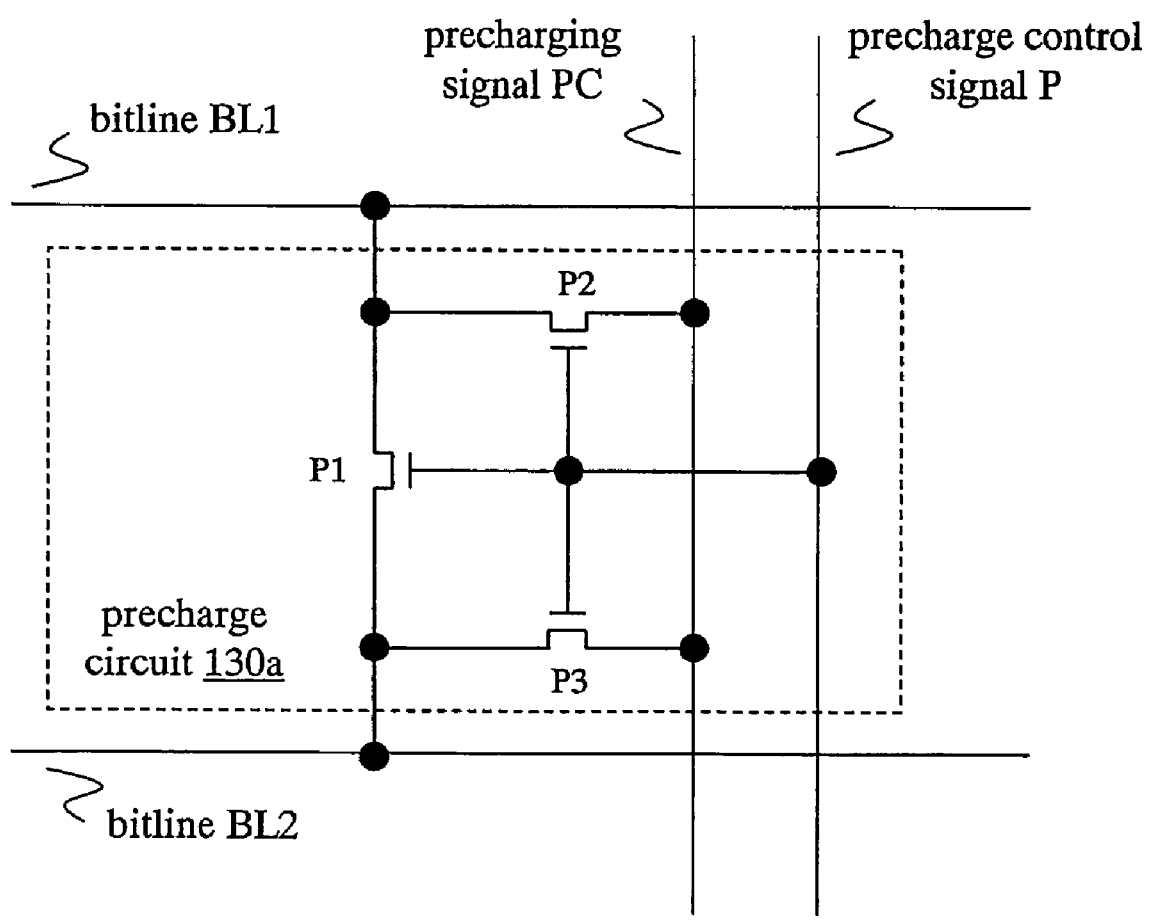
FIG. 3 is a schematic diagram of a precharge circuit.

As mentioned above, the inherent capacitances of the bitlines are precharged before selection of a cell for reading. FIG. 3 shows a schematic diagram for a precharge circuit 130a suitable for use in a device as shown in FIG. 2. This circuit includes three series-connected N-channel FETs P1–P3 having one junction connected to each bitline and the ends of the series connected to a precharging signal PC that has a potential of Vblp. In an exemplary application, Vblp has a value of Vdd/2. The gates of FETs. P1–P3 are connected together and to an active-low precharge control signal P.

A precharge circuit as shown in FIG. 3 may also be referred to as an equalizer. Other types of precharge circuits as are known in the art may also be substituted as precharge circuit 130.

Figure 4:
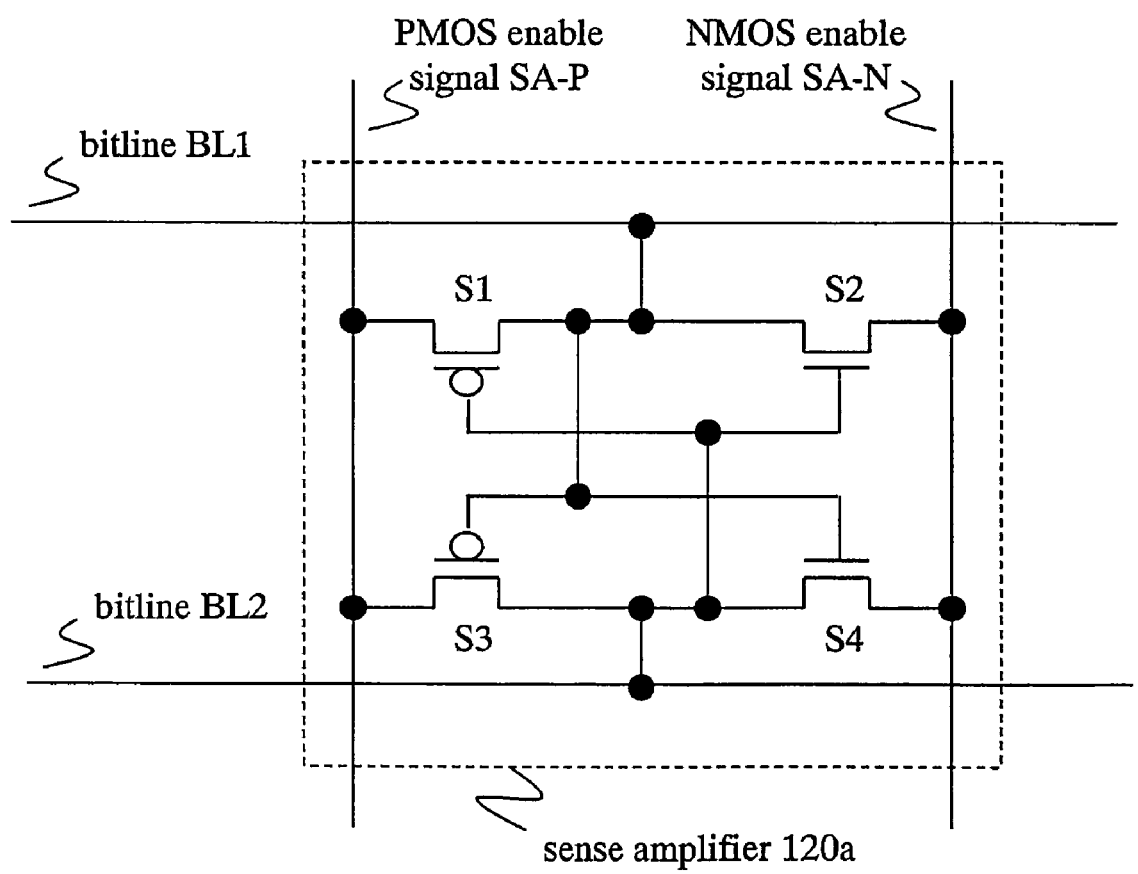
FIG. 4 is a schematic diagram of a sense amplifier.

Upon charge sharing, a voltage change $\Delta V$ occurs on the corresponding bitline. Because the charge stored in the cell capacitor is very small (a capacitance of cell capacitor C may be less than one hundred femtofarads), detection of the stored voltage level usually requires amplification of $\Delta V$. FIG. 4 shows a schematic diagram for a sense amplifier 120a suitable for use in a device as shown in FIG. 2. Sense amplifier 120a includes two P-channel FETs S1, S3 having their series-connected source-drain circuits connected across bitlines BL1, BL2 and their junction connected to an active-high enable signal SA-P. Sense amplifier 120a also includes two N-channel FETs S2, S4 having their series-connected source-drain circuits connected across bitlines BL1, BL2 and their junction connected to an active-low enable signal SA-N. The gates of the pair of FETs that are connected to each bitline are connected together and to the other bitline.

A sense amplifier circuit as shown in FIG. 4 may be characterized as two CMOS inverters connected in opposite directions across bitlines BL1 and BL2. Such a circuit may also be viewed as one form of a latching sense amplifier. Other forms of latching sense amplifier circuits, and various other types of sense amplifier circuits such as current-mirror sense amplifier circuits, are known in the art and may also be substituted as sense amplifier 120.

Figure 5:
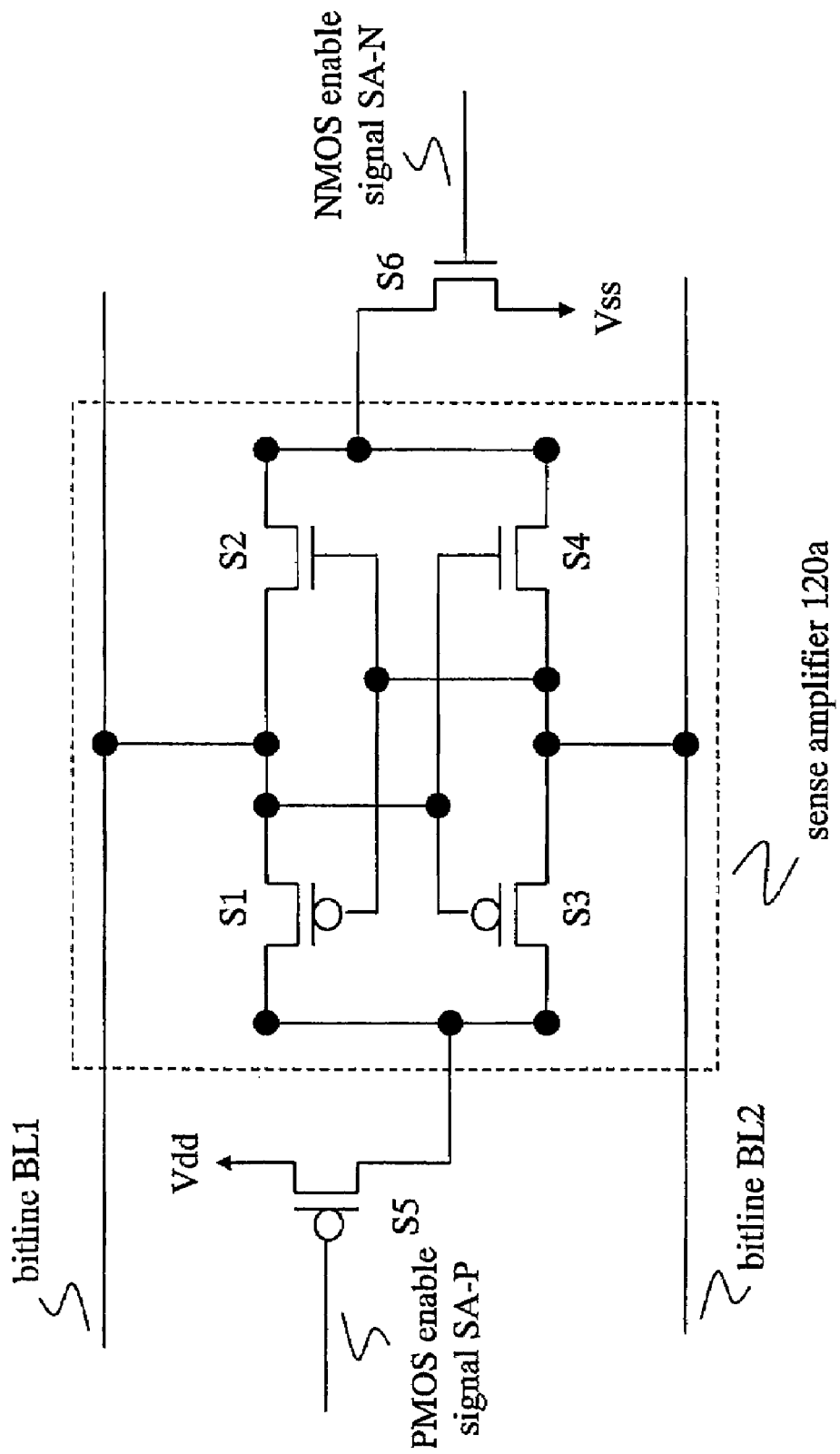
FIG. 5 is a schematic diagram of a circuit including a sense amplifier.

The circuit of sense amplifier 120a may also be modified as shown in FIG. 5. This modification includes a P-channel FET S5 having its gate connected to enable signal SA-P, with one terminal of its source-drain circuit connected to Vdd and the other to the junction of the P-channel source-drain circuits of FETs S1, S3. The modification also includes an N-channel FET S6 having its gate connected to enable signal SA-N, with one terminal of its source-drain circuit connected to Vss and the other to the junction of the N-channel source-drain circuits of FETs S2, S4.

Figure 6:
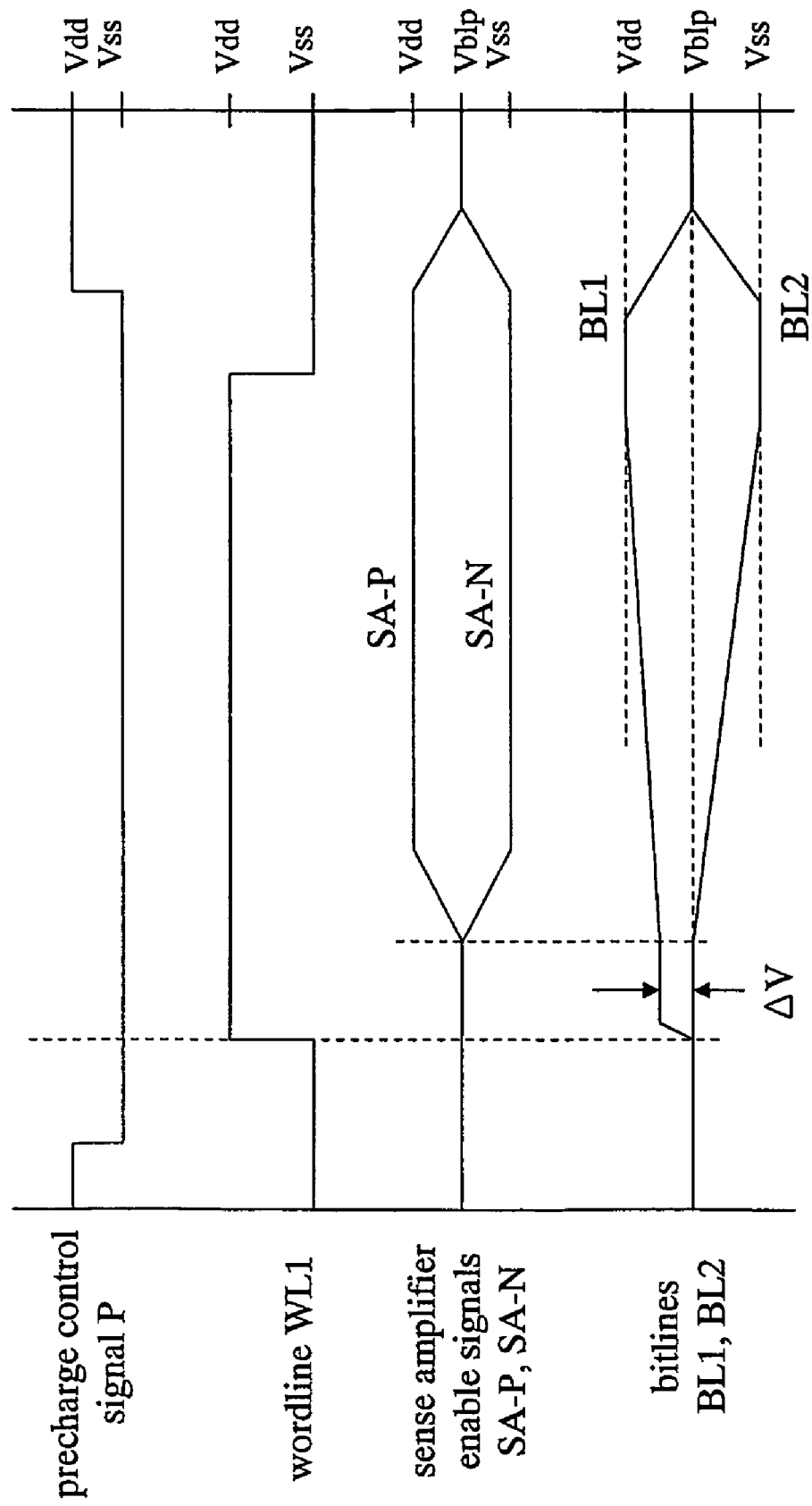
FIG. 6 is a timing diagram of a device as shown in FIG. 2.

FIG. 6 shows a timing diagram of an exemplary application of a device as shown in FIG. 2 in a case where a high data value has been stored in cell 1 of array 110. During standby mode of the DRAM device, control signal P of precharge circuit 130 has a high level, and the inherent capacitances of bitlines BL1, BL2 are precharged to a potential Vblp. During active mode of the DRAM device, precharge control signal P is pulled low, causing bitlines BL1, BL2 to float. Cell 1 is then selected by pulling wordline WL1 high, thus activating transistor M1.

Upon activation of transistor Ml, charge sharing occurs between cell capacitor C1 and the (precharged) inherent capacitance of bitline BL1. As cell capacitor C1 stores a high data value in this example, the charge sharing raises the voltage on bitline BL1 by $\Delta V$ as compared to the voltage Vblp on the reference bitline BL2. Sense amplifier 120 is activated by pulling enable signals SA-P and SA-N high and low, respectively, causing sense amplifier 120 to amplify the voltage levels on bitlines BL1, BL2 to Vdd and Vss, respectively.

Figure 7:
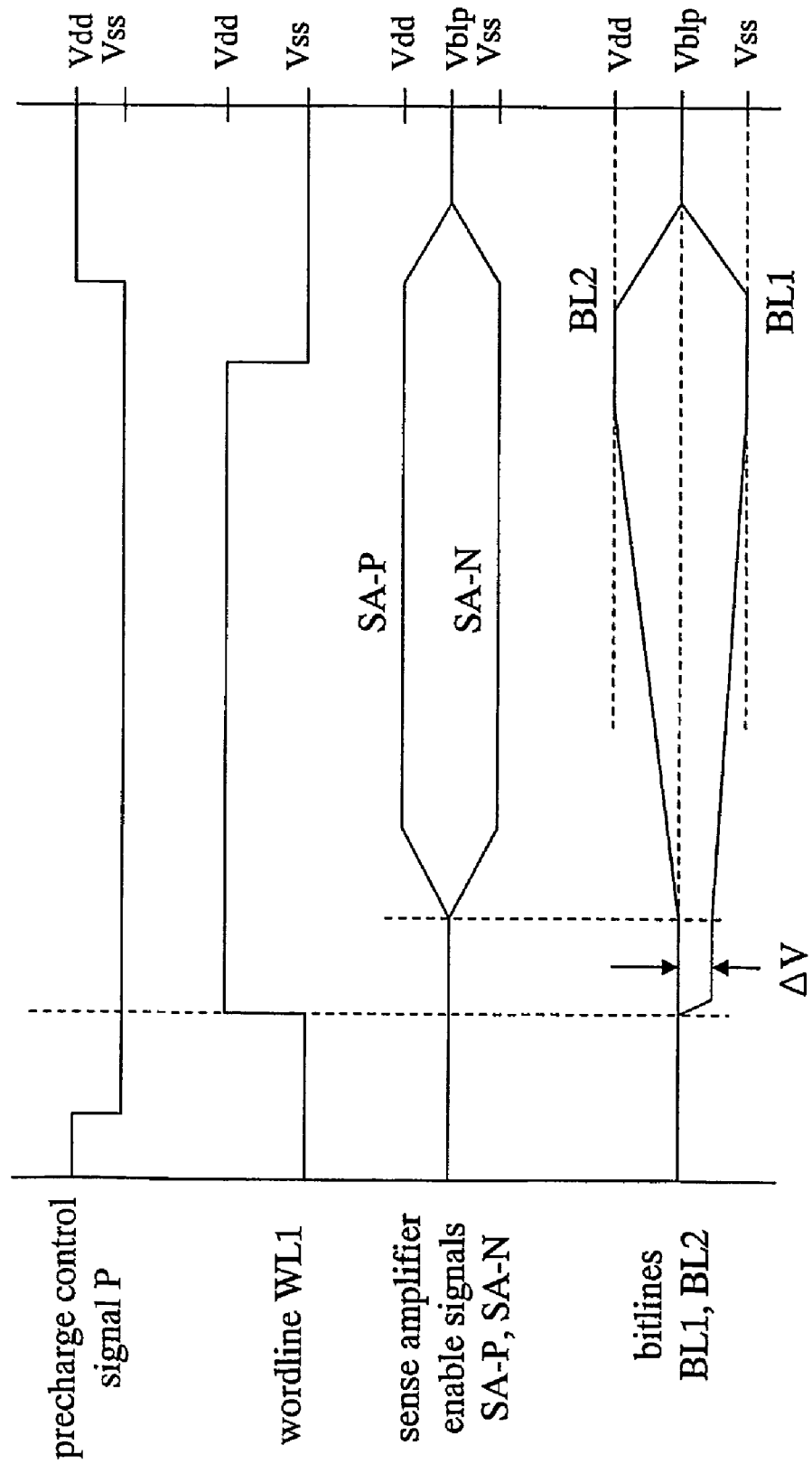
FIG. 7 is a timing diagram of a device as shown in FIG. 2.

FIG. 7 shows a timing diagram of an exemplary application of a device as shown in FIG. 2 in a case where a low data value has been stored in cell 1 of array 110. As cell capacitor C1 stores a low data value in this example, charge sharing results in a decrease of the voltage on bitline BL1 by $\Delta V$ as compared to the voltage Vblp on the reference bitline BL2. Upon activation, sense amplifier 120 amplifies the voltage levels on bitlines BL1, BL2 to Vss and Vdd, respectively.

As the charge level on a cell capacitor deteriorates, the voltage change $\Delta V$ produced on the bitline upon charge sharing decreases. If the voltage change $\Delta V$ falls below the sense margin of sense amplifier 120, then the charge level can no longer be distinguished (i.e. is no longer readable by the sense amplifier), and the stored data value is lost.

A cell capacitor as shown in FIG. 1 can typically maintain a low charge level (i.e. a charge level corresponding to a low voltage or data value) to a readable level over a longer period than it can maintain a high charge level (i.e. a charge level corresponding to a high voltage or data value) to a readable level. For example, a cell capacitor may maintain a low charge level to a readable level for several seconds, while the same cell capacitor may maintain a high charge level to a readable level for only several hundred milliseconds or less—a disparity of roughly one order of magnitude.

It is impractical for the stored information to be known a priori, and refresh operations in a memory system including DRAM devices are usually designed to occur periodically, with the period being determined by the worst case. Therefore, it is customary for the maximum time between refresh operations in a DRAM device to be not greater than the minimum period over which a high charge level may be expected to remain readable, even though cells storing low charge levels may be expected to remain readable for a longer period.

In a method according to an embodiment of the present invention, a period of readability for a high charge level is increased. In an apparatus according to one embodiment of the invention, a bias circuit is configured to reduce a difference between the period of readability for the high charge level and the period of readability for the low charge level.

Figure 8:
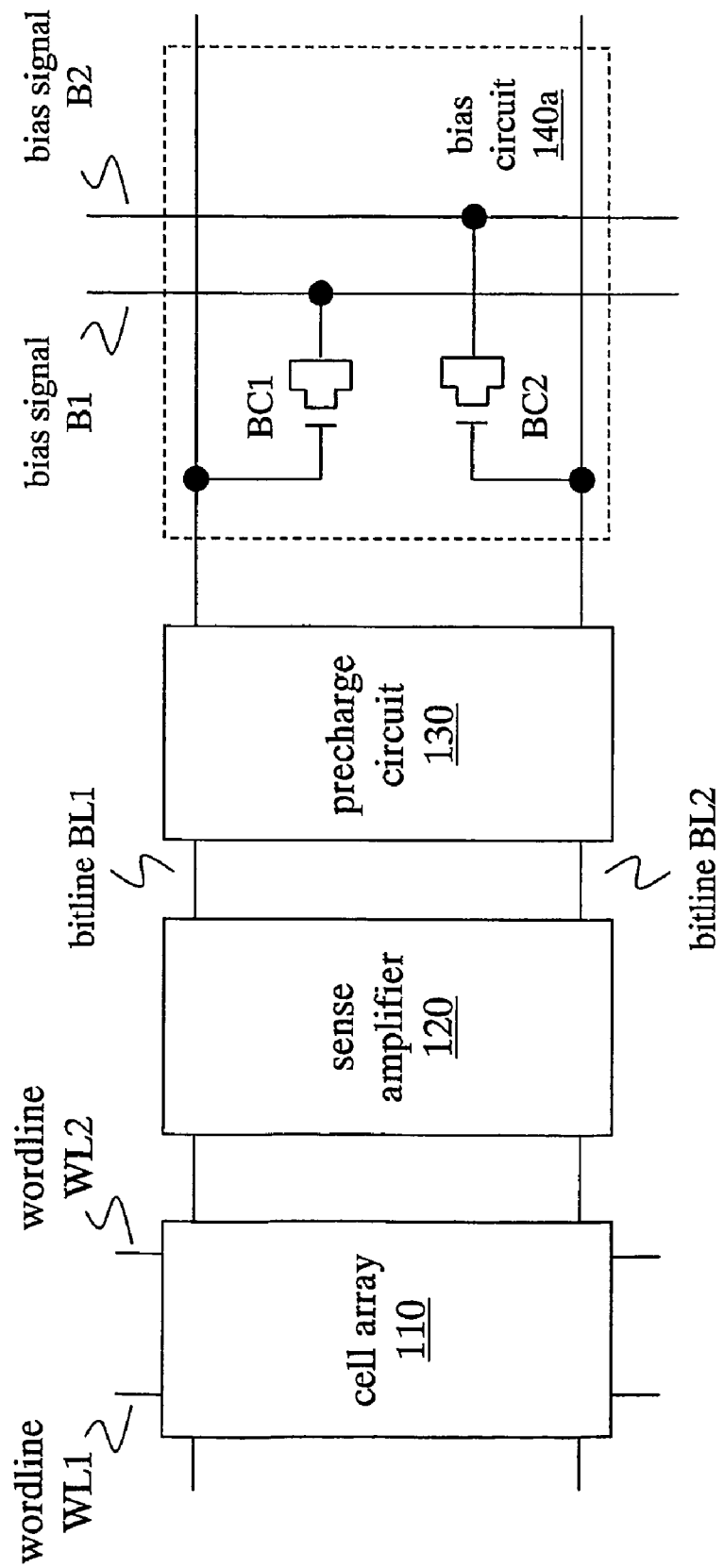
FIG. 8 is a block diagram of a device according to an embodiment of the invention.

FIG. 8 shows a device including a bias circuit 140a according to an embodiment of the invention. Bias circuit 140a includes a bias capacitor BC1, having one end connected to bitline BL1 and the other end connected to an active-low bias signal B1, and a bias capacitor BC2, having one end connected to bitline BL2 and the other end connected to an active-low bias signal B2. As shown in FIG. 8, bias capacitors BC1, BC2 may each be fabricated as an NMOS FET with the source and drain shorted together. In other implementations, bias capacitors BC1, BC2 may be fabricated as two-terminal capacitors (e.g. trench capacitors).

In an exemplary implementation, bias capacitors BC1, BC2 are fabricated as low-$V_t$ NMOS FETs. One possible advantage that may be realized in implementing a bias capacitor as a MOSFET is to minimize the amount of capacitance that the bias capacitor adds to the bitline. Other possible advantages to a device as shown in FIG. 8 may include ease of incorporation into existing processes, e.g. in terms of added process difficulty and required degree of circuit redesign. However, such advantages are not essential to the practice of the invention.

Figure 9:
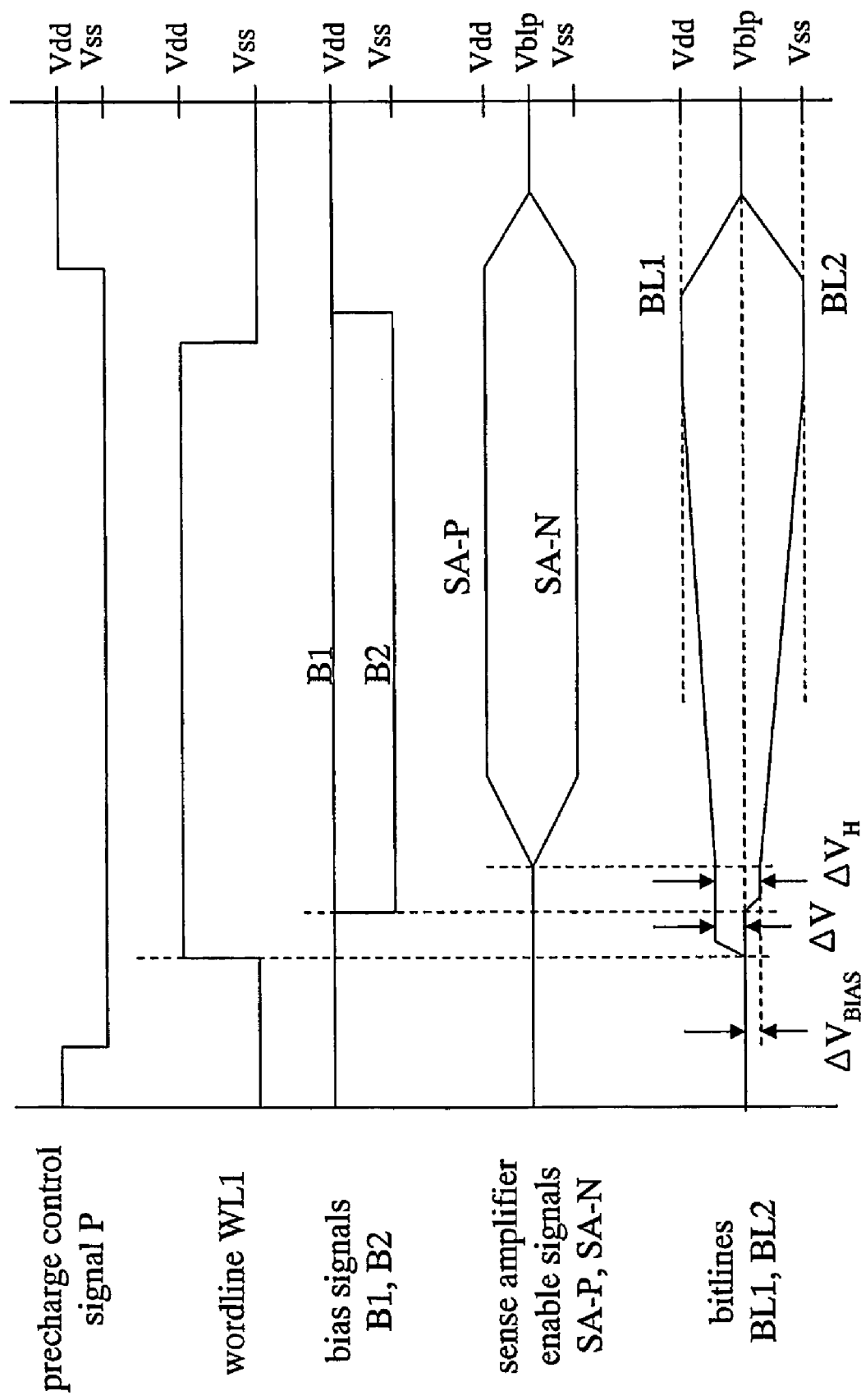
FIG. 9 is a timing diagram of a device as shown in FIG. 8.

FIG. 9 shows a timing diagram of a device as shown in FIG. 8 in a case where a high data value is read from a cell on bitline BL1. After the precharges on the bitlines have been equalized, and before the sense amplifier is enabled, the bias signal corresponding to the reference bitline (here, bias signal B2 corresponding to bitline BL2) is pulled low. As a result, the voltage on bitline BL2 drops below Vblp by an amount $\Delta V_{BIAS}$, and the voltage difference between the bitlines is increased from $\Delta V$ to $\Delta V_H$ (where $\Delta V_{H=\Delta V+\Delta V_{BIAS}}$). Although FIG. 9 shows that bias signal B2 is pulled low after activation of wordline WL, in another implementation bias signal B2 may be pulled low before and/or during activation of wordline WL.

Figure 10:
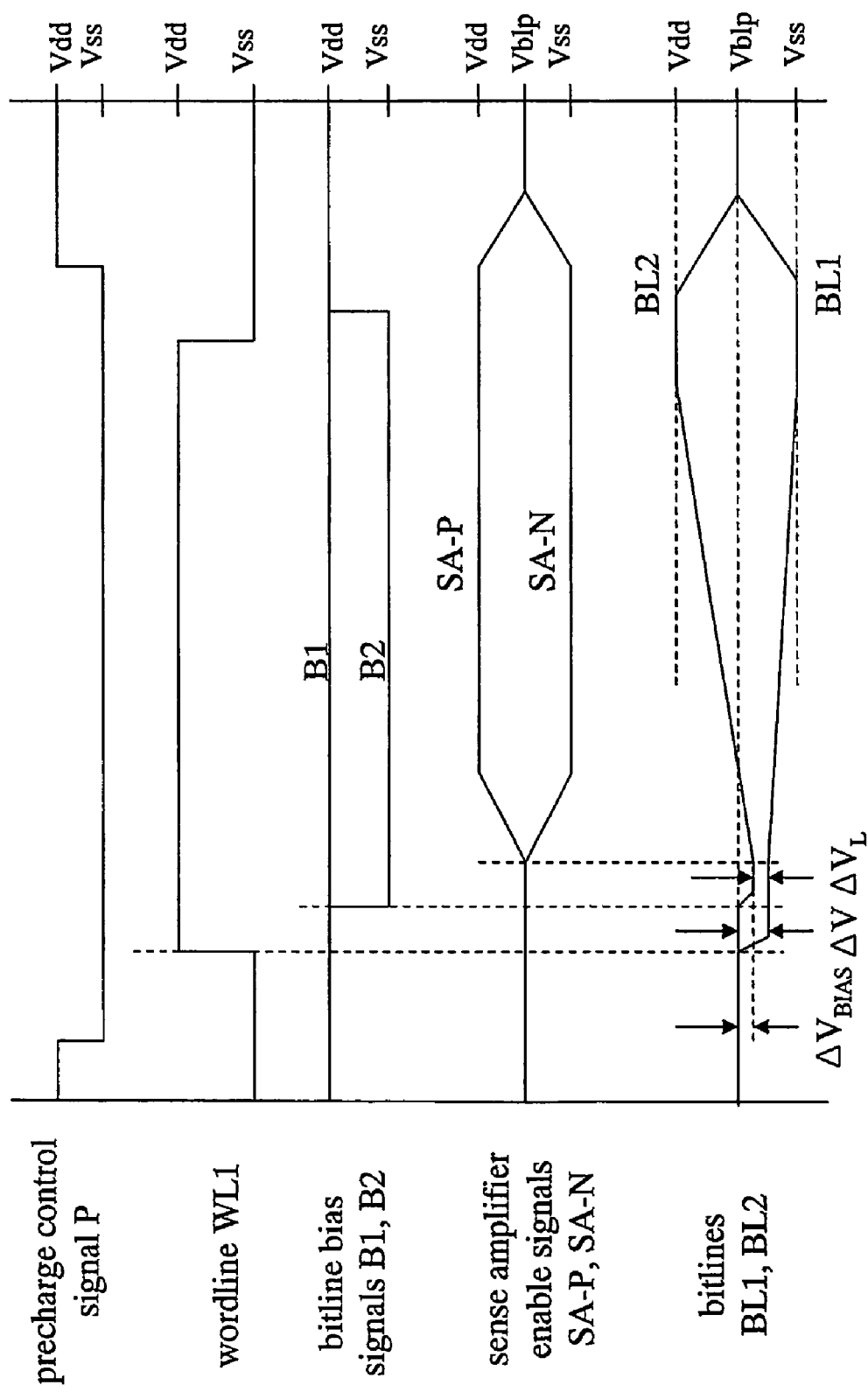
FIG. 10 is a timing diagram of a device as shown in FIG. 8.

FIG. 10 shows a timing diagram of a device as shown in FIG. 8 in a case where a low data value is read from a cell on bitline BL1. In this case as well, after the precharges on the bitlines have been equalized, and before the sense amplifier is enabled, the bias signal corresponding to the reference bitline (here, bias signal B2 corresponding to bitline BL2) is pulled low. As a result, the voltage on bitline BL2 drops below Vblp by a voltage change $\Delta V_{BIAS}$, and the voltage difference between the bitlines is reduced from $\Delta V$ to $\Delta V_L$ (where $\Delta V_L=\Delta V-\Delta V_{BIAS}$). As noted above, in another implementation bias signal B2 may be pulled low before and/or during activation of wordline WL. It may be desirable to choose a magnitude of $\Delta V_{BIAS}$ such that the voltage difference $\Delta V_L$ will not fall below a sense margin of the sense amplifier.

Figure 11:
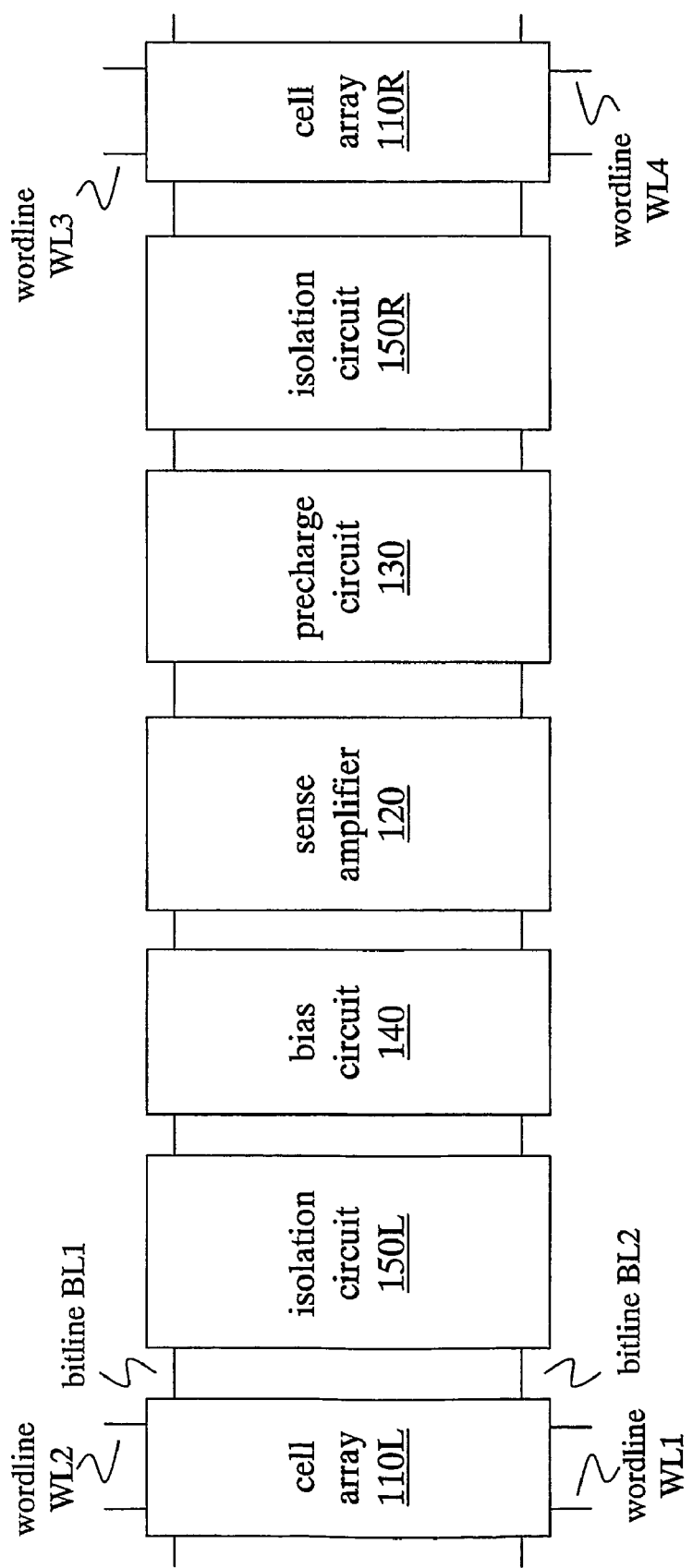
FIG. 11 is a block diagram of a device according to another embodiment of the invention.
Figure 12:
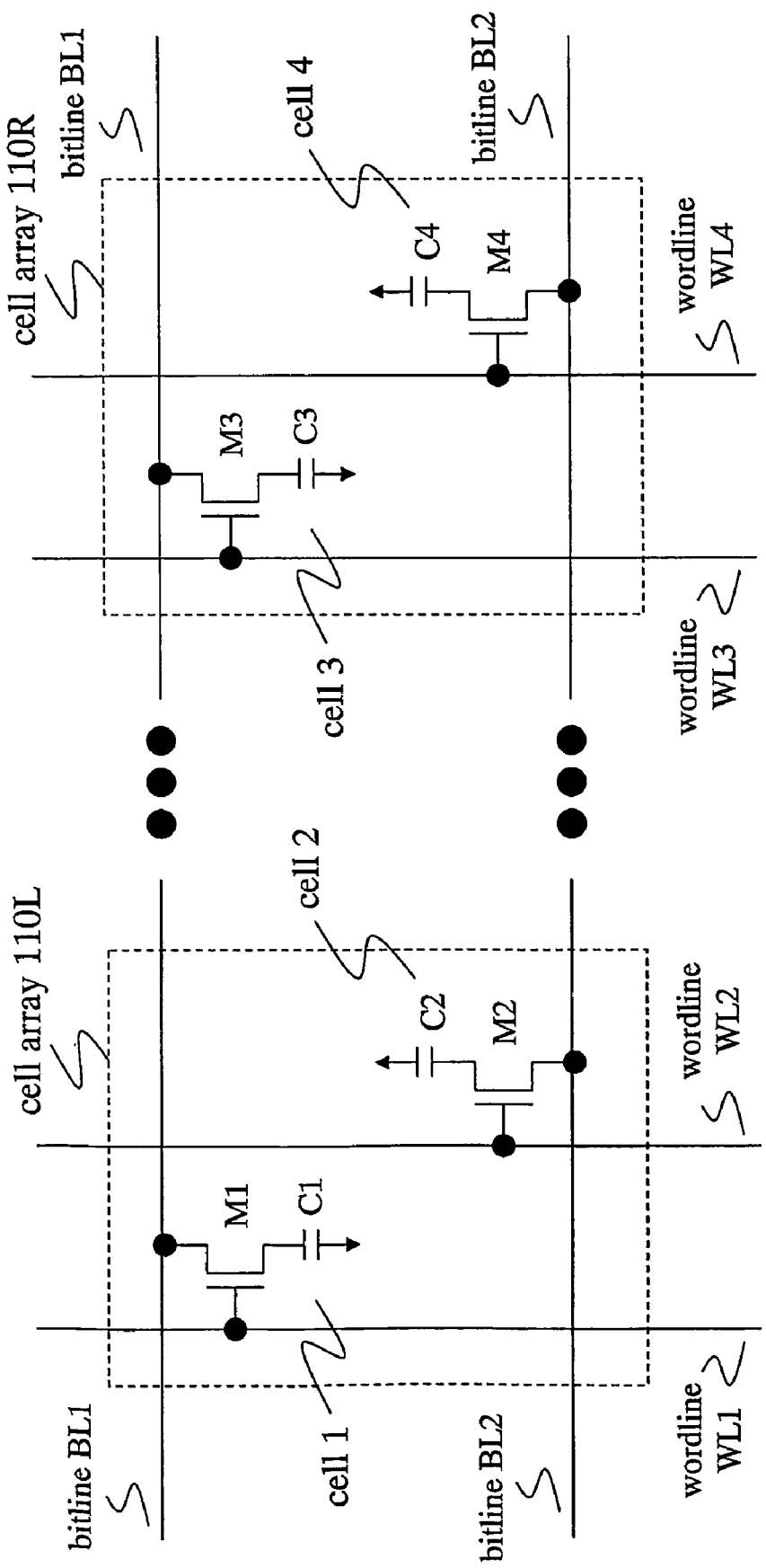
FIG. 12 is a block diagram of two cell arrays.

In existing DRAM devices, it is typical for one instance of circuitry such as a sense amplifier and a precharge circuit to be shared among more than one cell array. In a device according to a further embodiment of the invention, one instance of bias circuit 140 may also be shared among more than one cell array 110. Such an arrangement may include circuits to isolate the array or arrays not being read. FIG. 11 shows a block diagram of a device according to an embodiment of the invention that includes two cell arrays 110L, 110R and isolation circuits 150L, 150R. FIG. 12 shows a block diagram of an exemplary implementation of cell arrays 110L, 110R suitable for use in a device as shown in FIG. 11, with cells 1–4 each comprising a respective one of FETs M1–4 and a respective one of cell capacitors C1–4.

Figure 13:
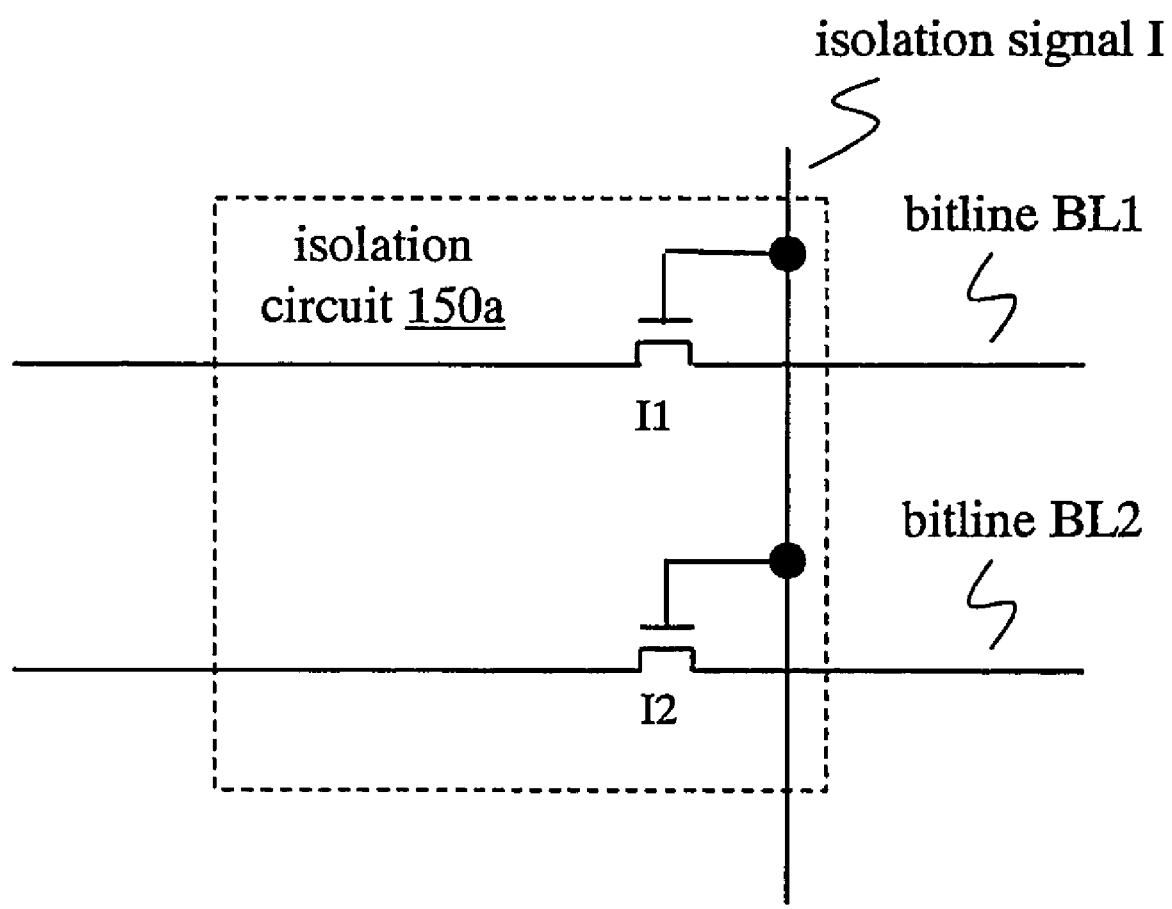
FIG. 13 is a schematic diagram of an isolation circuit.

FIG. 13 shows a schematic diagram of an isolation circuit 150a suitable for use in a device as shown in FIG. 11. Isolation circuit 150a includes two N-channel FETs I1, I2, with the source-drain circuit of each FET being series-connected to a respective one of the bitlines BL1, BL2 and the gates of the two FETs being connected to an isolation signal I. In other implementations, P-channel devices may be used instead of (or in addition to) the N-channel devices of an isolation circuit as shown in FIG. 13, with a corresponding change as appropriate in the polarity and/or value of isolation signal I.

Figure 14:
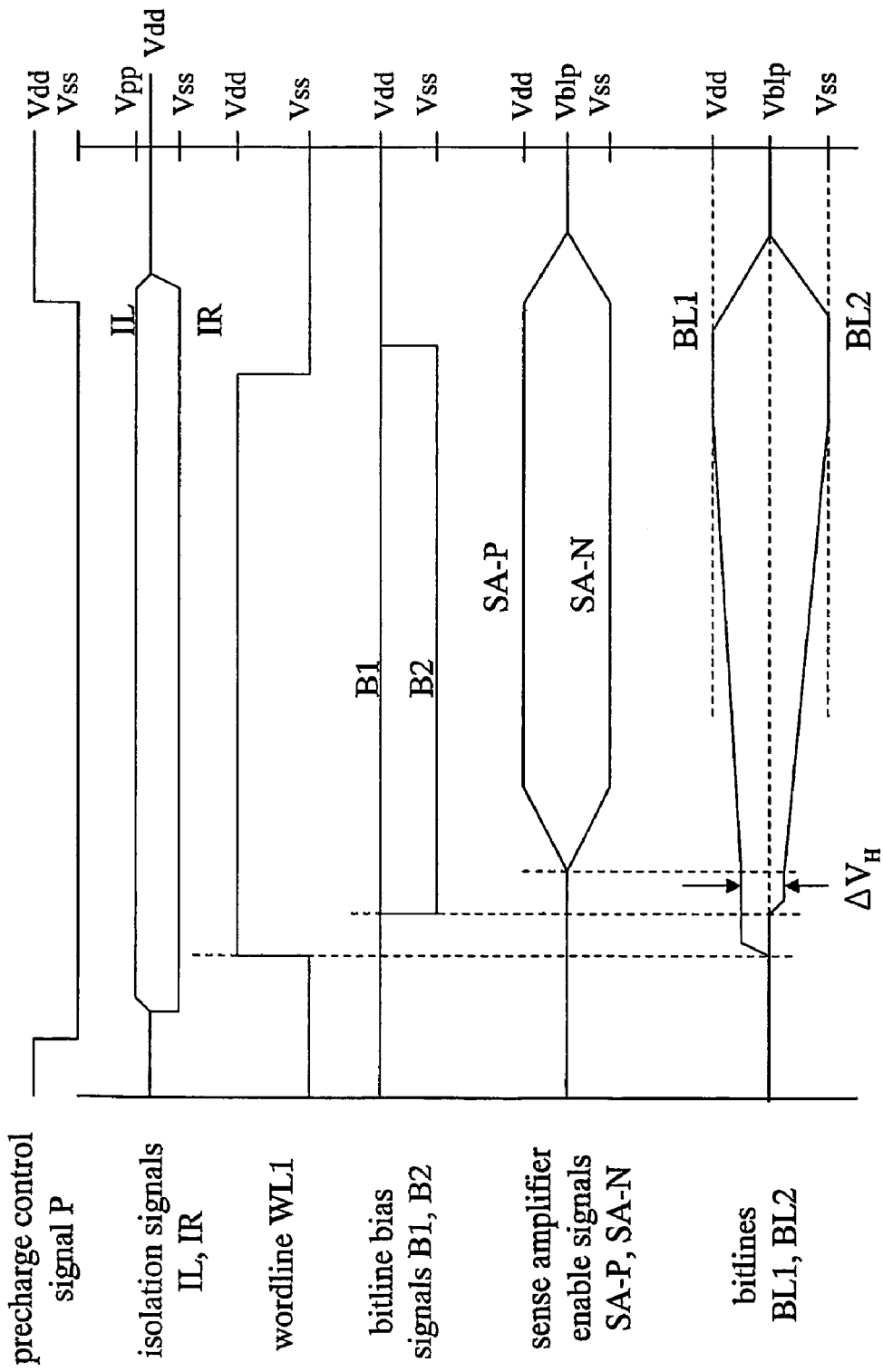
FIG. 14 is a timing diagram of a device as shown in FIG. 11.

FIG. 14 shows a timing diagram of a device as shown in FIG. 13 in a case where a high data value is read from cell 1 of cell array 110L. Upon activation of precharge control signal P, isolation signal IL of isolation circuit 150L is raised to an increased voltage level Vpp to select cell array 110L, and isolation signal IR of isolation circuit 150R is lowered to Vss to isolate cell array 110R. In another implementation, isolation signals IL, IR may be activated before precharging. Sensing of the charge level stored in the cell proceeds as described above.

In other implementations of a device as shown in FIG. 11, the series connection of sense amplifier 120, precharge circuit 130, and bias circuit 140 along bitlines BL1, BL2 may occur in any order. Although FIG. 11 shows cell arrays 110L and 110R being coupled to different wordlines, in another implementation the timing as shown in FIG. 14 may be varied to support reading different data values from arrays 110L and 110R for the same word.

It may be desirable to bias down a bitline that provides a reference potential rather than to bias down a bitline that shares charge. (Instead of, or in addition to, biasing down a bitline that provides a reference potential, it may be desirable in another application to bias up a bitline that shares charge.) A method according to a further embodiment of the invention includes selecting a bitline to be biased.

FIG. 11 shows a device in which two wordlines are coupled to each bitline. Specifically, wordlines WL1 and WL3 are coupled to bitline BL1, and wordlines WL2 and WL4 are coupled to bitline BL2. In practice, such a structure may be expanded such that many wordlines are coupled to each bitline. In a typical DRAM device, for example, 256 or 512 wordlines may be coupled to each bitline. (These wordlines may also be coupled to other bitlines that are connected to other cell arrays.) With respect to the two bitlines BL1 and BL2 that are connected to the cell arrays 110L and 110R, each wordline is coupled to one and only one of these two bitlines. Therefore, the (possibly many) wordlines coupled to the bitlines of the cell arrays are divided into two nonoverlapping sets: wordlines coupled to bitline BL1, and wordlines coupled to bitline BL2.

When a wordline is selected, the corresponding cell is activated and charge sharing occurs on the corresponding bitline. In an apparatus or method according to a further embodiment of the invention, selection of a wordline is used to identify the bitline to be biased. In the example of a device as shown in FIG. 11, if wordline WL2 or wordline WL4 is selected, then bitline BL1 is biased down, and if wordline WL1 or wordline WL3 is selected, then bitline BL2 is biased down.

The foregoing presentation of the described embodiments is provided to enable any person skilled in the art to make or use the present invention. Various modifications to these embodiments are possible, and the generic principles of utilizing a biasing circuit within a memory device presented herein may be applied to other embodiments as well. For example, embodiments of the invention may be implemented in part or in whole as a hard-wired circuit or as a circuit configuration fabricated into an application-specific integrated circuit. A device according to an embodiment of the invention may also be fabricated including one or more DRAM cell designs as are known in the art other than the one-transistor cell shown in FIG. 1: for example, a three-transistor (3T) cell design.

A device according to an embodiment of the invention as described herein may be used in several different DRAM implementations, including synchronous DRAM (SDRAM), double data rate DRAM (DDR DRAM), and Rambus DRAM (RDRAM). Methods according to embodiments of the invention may also be practiced in DRAM devices for storage of non-binary data values (i.e. data values indicating more than two levels). Principles of the invention may also be applied to embedded DRAM products such as embedded graphics controllers. Thus, the present invention is not intended to be limited to the embodiments shown above but rather is to be accorded the widest scope consistent with the principles and novel features disclosed in any fashion herein.

What is claimed is:

1. A method of data access, said method comprising:
   precharging a first bitline and a second bitline to a precharge voltage;
   permitting charge sharing between a capacitance of a memory cell and one of the precharged first bitline and the precharged second bitline;
   biasing the other of the precharged first bitline and the precharged second bitline to decrease a voltage level of the biased bitline below the precharge voltage in order to increase a refresh period; and
   subsequent to said permitting charge sharing and said biasing, sensing a difference between a potential of the first bitline and a potential of the second bitline.

2. The method according to claim 1, wherein sensing the difference between a potential of the first bitline and a potential of the second bitline includes amplifying said difference.

3. The method according to claim 1, wherein said permitting charge sharing includes applying a potential to a gate of a transistor of the memory cell.

4. The method according to claim 1, wherein said biasing includes applying a potential to a bias capacitor coupled to the the other of the precharged first bitline and the precharged second bitline.

5. A method of data access, said method comprising:
   selecting a wordline to perform charge sharing between a memory cell and a bitline coupled to the wordline;
   asserting a bias signal corresponding to the wordline for decreasing a potential of a reference bitline; and
   sensing a difference between a potential of the bitline coupled to the wordline and the decreased potential of the reference bitline.

6. The method according to claim 5, wherein said asserting the bias signal occurs subsequent to said selecting a wordline.

7. The method according to claim 5, wherein said sensing the difference includes sensing a difference between the potential of the bitline and the altered potential of the reference bitline.

8. A method of data access, said method comprising:
   precharging a first bitline and a second bitline to a precharge voltage;
   permitting charge sharing between a capacitance of a memory cell and the precharged first bitline;
   biasing a selected one of the precharged bitlines to decrease a voltage level of the biased bitline below the precharge voltage so as to increase a refresh period; and
   subsequent to said permitting charge sharing and said biasing, sensing a difference between a potential of the first bitline and a potential of the second bitline.

9. The method according to claim 8, wherein said biasing includes applying a potential to a bias capacitor coupled to the selected bitline.

10. A semiconductor memory device comprising:
    a precharging circuit configured and arranged to precharge an active bitline and a reference bitline;
    a memory cell configured and arranged to share charge with the active bitline;
    a bias circuit configured and arranged to decrease a potential of the reference bitline to increase a refresh period in a semiconductor memory device; and
    a sense amplifier configured and arranged to sense a difference between a potential of the active bitline and a potential of the reference bitline.

11. The semiconductor memory device according to claim 10, wherein the memory cell includes a field-effect transistor and a capacitor.

12. The semiconductor memory device according to claim 10, wherein the memory cell is coupled to a wordline and is further configured and arranged to share charge with the active bitline upon a predetermined alteration in a potential of the wordline.

13. The semiconductor memory device according to claim 10, wherein the bias circuit includes a bias capacitor coupled to the reference bitline.

14. The semiconductor memory device according to claim 13, wherein the bias capacitor includes a metal-oxide-semiconductor field-effect transistor having a low threshold voltage.

15. The semiconductor memory device according to claim 14, wherein a magnitude of the threshold voltage of the metal-oxide-semiconductor field-effect transistor is less than three hundred millivolts.

16. The semiconductor memory device according to claim 13, wherein the bias capacitor includes an n-channel metal-oxide-semiconductor field-effect transistor having a low threshold voltage.

17. The semiconductor memory device according to claim 16, wherein a magnitude of the threshold voltage of the metal-oxide-semiconductor field-effect transistor is less than three hundred millivolts.

18. The semiconductor memory device according to claim 10, further comprising:
    a second memory cell configured and arranged to share charge with the active bitline;
    a first isolation circuit configured and arranged to isolate the memory cell from the sense amplifier; and
    a second isolation circuit configured and arranged to isolate the second memory cell from the sense amplifier.

* * * * *